United States Patent
Wu et al.

(10) Patent No.: US 6,777,709 B2
(45) Date of Patent: Aug. 17, 2004

(54) STORAGE CAPACITOR STRUCTURE

(75) Inventors: Yuan-Liang Wu, Tainan Hsien (TW); Chin-Jung Kuo, Kaohsiung Hsien (TW)

(73) Assignee: Chi Mei Optoelectronics Corporation, Tainan County (TW)

( * ) Notice: Subject to any disclaimer, the term of this patent is extended or adjusted under 35 U.S.C. 154(b) by 0 days.

(21) Appl. No.: 10/065,379

(22) Filed: Oct. 10, 2002

(65) Prior Publication Data

US 2003/0080339 A1 May 1, 2003

(30) Foreign Application Priority Data

Nov. 1, 2001 (TW) ........................................ 90127128 A

(51) Int. Cl.$^7$ ........................ H01L 29/04; H01L 31/036
(52) U.S. Cl. ........................ 257/59; 257/72; 257/532; 349/38
(58) Field of Search ........................... 257/59, 72, 350, 257/532; 349/38, 42, 43

(56) References Cited

U.S. PATENT DOCUMENTS 6,521,913 B1 * 2/2003 Murade ....................... 257/59
2002/0131010 A1 * 9/2002 Ozaki et al. ................ 349/192

* cited by examiner

Primary Examiner—Minh-Loan Tran
(74) Attorney, Agent, or Firm—J.C. Patents

(57) ABSTRACT

A storage capacitor structure comprising a first capacitor electrode over a substrate, a capacitor dielectric layer over the first capacitor electrode and a second capacitor electrode over the capacitor dielectric layer, a passivation layer over the second capacitor electrode and a pixel electrode layer over the passivation layer. The passivation layer has an opening that exposes a portion of the second capacitor electrode. The pixel electrode layer has a protruding section that permits electrical connection with the second capacitor electrode through the opening in the passivation layer. If the first capacitor electrode and the second capacitor electrode are in short circuit, the protruding section may be cut to detach the pixel electrode layer from the second capacitor electrode.

16 Claims, 5 Drawing Sheets

STORAGE CAPACITOR STRUCTURE

CROSS REFERENCE TO RELATED APPLICATIONS

This application claims the priority benefit of Taiwan application serial no. 90127128, filed Nov. 1, 2001.

BACKGROUND OF INVENTION

1. Field of Invention

The present invention relates to a type of display device. More particularly, the present invention relates to a storage capacitor structure of a display device.

2. Description of Related Art

Display devices have found widespread usage in our daily life. Television and computer monitors are common display devices that show different kinds of images or motions on a screen. Formerly, cathode ray tubes were widely used. However, due to bulkiness and power consumption, cathode ray tubes cannot be used for portable equipment such as a notebook computer. Nowadays, consumers welcome the newly developed dot matrix type of flat panel displays such as liquid crystal display (LCD) or thin film transistor (TFT) LCD. An array of picture pieces or pixels on the TFT LCD constitutes an image with the switching of each pixel controlled by a thin film transistor.

FIG. 1 is a schematic diagram showing the driving circuit of a conventional thin film transistor liquid crystal display. The TFT LCD requires a scan circuit 100 and a signal-holding circuit 102. The scan circuit 100 drives a group of scan lines 110 and the signal-holding circuit 102 drives a group of signal lines 112. The scan lines 110 and the signal lines 112 cross each other perpendicularly forming a two-dimensional array. Each cross-point in the two-dimensional array has a thin film transistor 104, a storage capacitor 108 and a liquid crystal display (LCD) cell 106. The thin film transistor 104, the storage capacitor 108 and the LCD cell 106 together constitute a pixel. The gate terminal of the thin film transistor 104 is controlled by the corresponding scan line 110 and the source terminal of the thin film transistor 104 is controlled by the corresponding signal line 112. The drain terminal of the thin film transistor 104 is connected to a pixel electrode layer and an electrode of the storage capacitor 108. The storage capacitor 108 maintains a voltage for controlling the liquid crystals. Another electrode of the storage capacitor 108 is connected to an adjacent scan line.

Following the gradual reduction in dimensional layout of a thin film transistor, a common electrode type of storage capacitor design is selected for reducing the effect of gate-driven delay. In this design, the common electrode and the gate terminal are separated from each other so that the other terminal of the capacitor receives a common voltage such as a common electrode voltage (Vcom).

FIG. 2A is a schematic layout diagram of a unit cell of a conventional thin film transistor liquid crystal display device. As shown in FIG. 2A, the gate terminal of the thin film transistor 104 is connected to the scan line 110. The source terminal of the thin film transistor 104 is connected to the corresponding signal line 112. The drain terminal of the thin film transistor 104 is connected to a pixel electrode layer 118. A lower electrode 114 and an upper electrode 116 together constitute a storage capacitor. The pixel electrode layer 118 and the upper electrode 116 are linked through an opening 120.

FIG. 2B is a diagram showing a cross-sectional view along line I—I of FIG. 2A. As shown in FIG. 2B, a first metallic layer is formed over a transparent substrate 126. The lower electrode 114 together with the gate terminal of the thin film transistor 104 are formed by patterning the metallic layer. A capacitor dielectric layer 124 is formed over the lower electrode 114. A metallic electrode layer 116 is formed over the capacitor dielectric layer 124 to serve as the upper electrode of the storage capacitor. The overlapping region between the upper electrode 116 and the lower electrode 114 is the main charge storage area for the capacitor. A passivation layer 122 is formed over the upper electrode 116 and surrounding areas. The passivation layer 122 has an opening 120 that exposes a portion of the upper electrode 116. A pixel electrode layer 118 is electrically connected to the upper electrode 116 through the opening 120.

In the aforementioned LCD structure, if some extrinsic residual material 115 remains somewhere in the neighborhood of the capacitor, especially near the edge of the lower electrode 114, a short-circuit path may form. Hence, the storage capacitor 108 may lose its function leading to point defect in the pixel. The extrinsic residual material 115 may be removed by shining a laser beam. However, the process may also break the normal line connection with the common electrode 114 and lead to a shallow line for the gate terminal. To prevent the formation of shallow lines, most design engineers prefer not to repair the defective capacitor and leave the bright spot as it is.

Nevertheless, stringent demand for high quality image in the market is a major force for the use of laser to repair bright spot and attain a zero bright spot target. At present, laser repair technique has not progressed far enough for spot darkening to be carried out as routine. This is because the common electrode and the gate terminal may form a short circuit after the repair resulting in a bright line defect. Thus, any method capable of repairing storage capacitor point defect and at the same time permitting the execution of spot darkening operations is needed for improving image quality.

SUMMARY OF INVENTION

Accordingly, one object of the present invention is to provide a storage capacitor structure such that a pixel electrode and an electrode of the capacitor can be detached by cutting if the two electrodes of the capacitor form a short circuit. In this way, the pixel electrode serves as an electrode for the capacitor so that the overlapping portion between the pixel electrode and the capacitor electrode still constitute a storage capacitor.

To achieve this and other advantages and in accordance with the purpose of the invention, as embodied and broadly described herein, the invention provides a storage capacitor structure. The storage capacitor structure includes a first capacitor electrode over a substrate. A capacitor dielectric layer is formed over the first capacitor electrode. A second capacitor electrode is formed over the capacitor dielectric layer. A passivation layer is formed over the second capacitor electrode. The passivation layer has an opening that exposes a portion of the second capacitor electrode. A pixel electrode layer is formed over the passivation layer such that the pixel electrode layer has a protruding section for connecting with the second capacitor electrode through the opening in the passivation layer. When the first capacitor electrode and the second capacitor electrode form a short circuit, the protruding section may be cut to separate out the second capacitor electrode.

In the aforementioned storage capacitor structure, if the first capacitor electrode and the second capacitor electrode are in short circuit, the protruding section is cut to detach it from the second capacitor electrode. Thereafter, the pixel electrode layer also serves as an upper electrode of the storage capacitor.

In the aforementioned storage capacitor structure, the protruding section of the pixel electrode layer further includes a neck section and a connective section. The neck section is a removable section that can be cut for detachment, while the connective section and the second capacitor electrode are joined together.

In the aforementioned storage capacitor structure, the pixel electrode layer lies outside the protruding section. However, the pixel electrode layer also overlaps with a portion of the second capacitor electrode and the first capacitor electrode.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
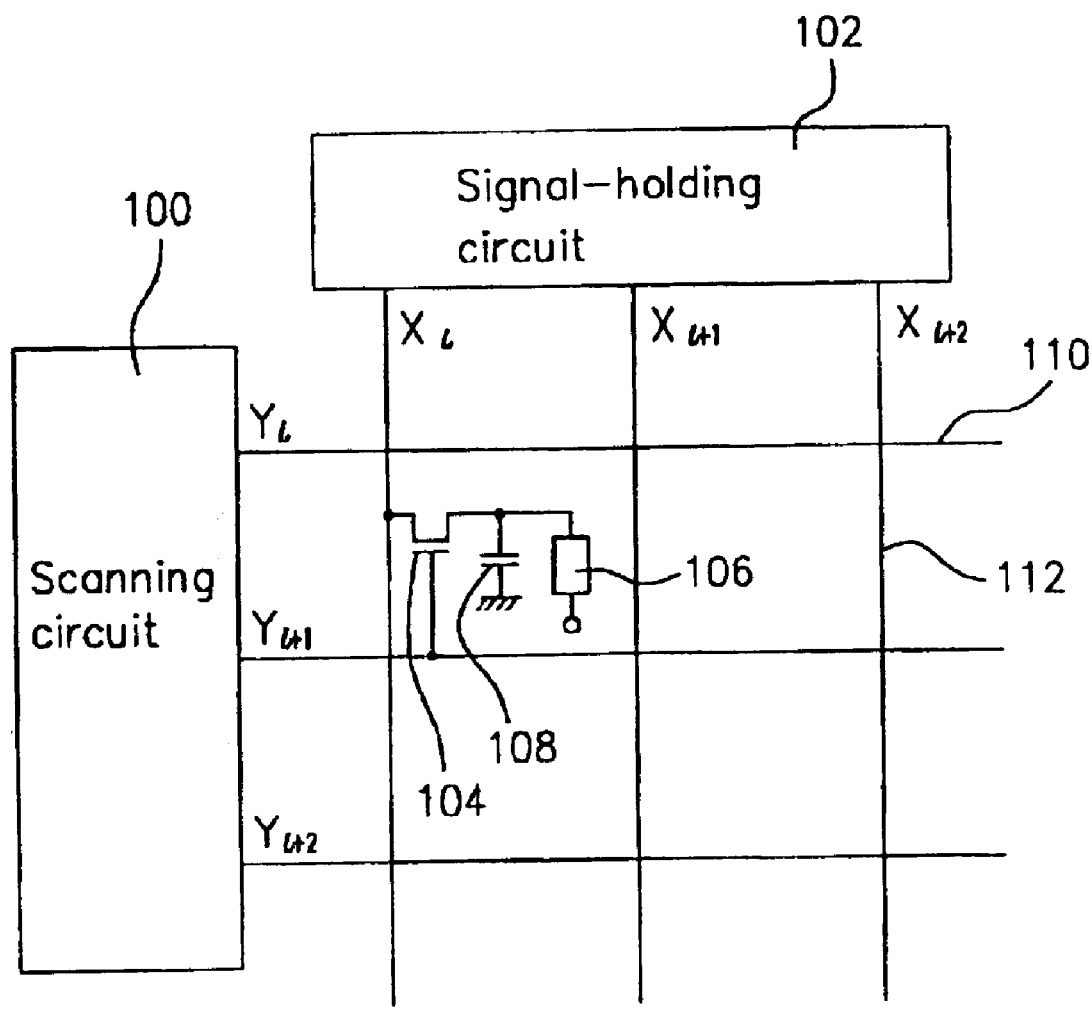
FIG. 1 is a schematic diagram showing the driving circuit of a conventional thin film transistor liquid crystal display.
Figure 2A:
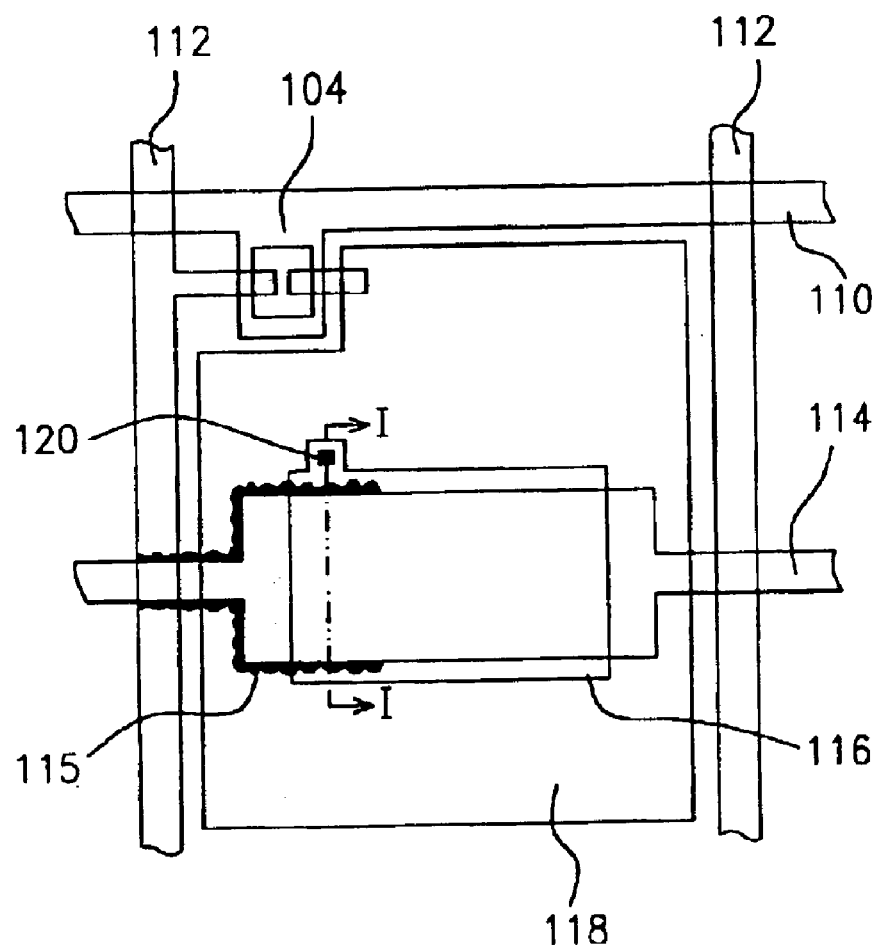
FIG. 2A is a schematic layout diagram of a unit cell of a conventional thin film transistor liquid crystal display device.
Figure 2B:
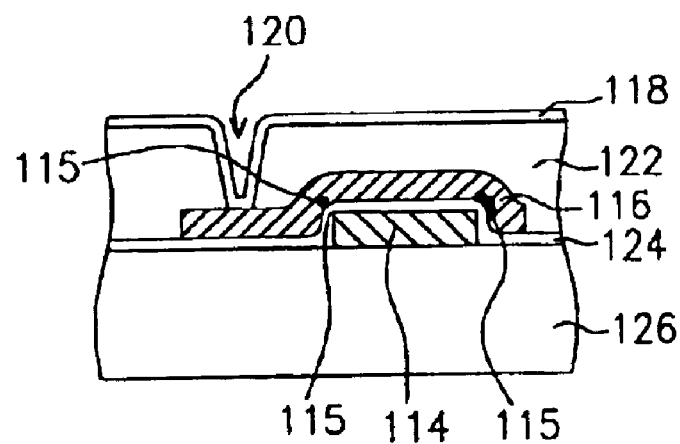
FIG. 2B is a diagram showing a cross-sectional view along line I—I of FIG. 2A.

Reference will now be made in detail to the present preferred embodiments of the invention, examples of which are illustrated in the accompanying drawings. Wherever possible, the same reference numbers are used in the drawings and the description to refer to the same or like parts.

One major aspect of this invention is the fabrication of a pixel electrode layer having a protruding section. If the two electrodes of a storage capacitor are in short circuit, the pixel electrode may be detached from the capacitor electrode of the storage capacitor by conducting a cutting operation. Thereafter, the pixel electrode may serve as an electrode of the storage capacitor so that the overlapping portion between the pixel electrode and the capacitor electrode still constitutes a storage capacitor.

Figure 3A:
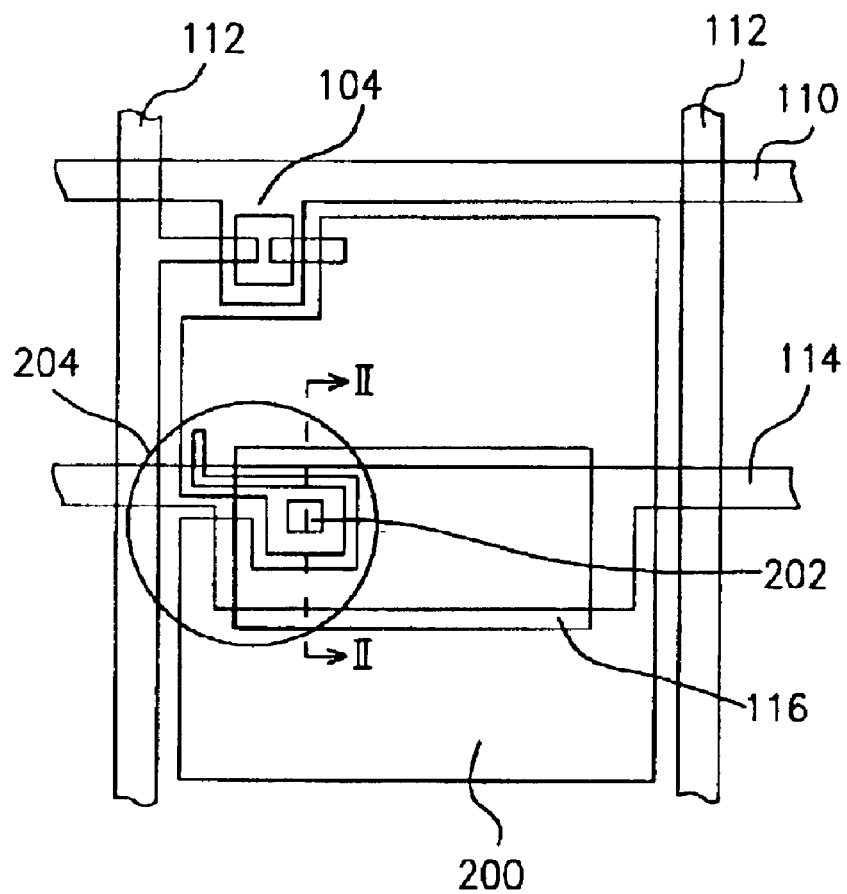
FIG. 3A is a schematic diagram showing the layout of a unit cell in a thin film transistor liquid crystal display according to a first preferred embodiment of this invention.

FIG. 3A is a schematic diagram showing the layout of a unit cell in a thin film transistor liquid crystal display according to a first preferred embodiment of this invention. As shown in FIG. 3A, the gate terminal of a thin film transistor 104 is connected to a scan line 110. The source terminal of the thin film transistor 104 is connected to a signal line 112. The drain terminal of the thin film transistor 104 is connected to a pixel electrode layer 200. A capacitor lower electrode 114 and a capacitor upper electrode 116 together form the storage capacitor. The pixel electrode layer 200 is electrically connected to the capacitor upper electrode 116 through an opening 202. In general, the thin film transistor 104 functions as a switching element for controlling the charging state of the liquid crystal capacitor. The opening 202 is formed, for example, in photolithographic and etching processes.

One major aspect of this invention is the formation of a protruding section in an area 204 over the pixel electrode layer 200. The pixel electrode layer 200 and the capacitor upper electrode 116 are electrically connected through the protruding section inside the opening 202. The protruding section has a neck section that can be removed to detach it from a main body 200b of the pixel electrode layer 200.

Figure 3B:
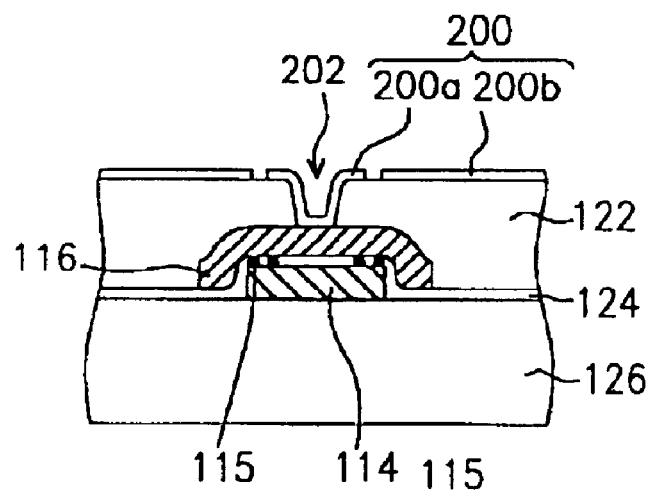
FIG. 3B is a diagram showing a cross-sectional view along line II—II of FIG. 3A.

FIG. 3B is a diagram showing a cross-sectional view along line II—II of FIG. 3A. The lower electrode 114 is formed over a transparent substrate 126. The lower electrode 114, also referred to as a first metallic layer, is formed together with the gate terminal of the thin film transistor 104. A capacitor dielectric layer 124 is formed over the lower electrode 114. A metallic electrode layer is formed over the capacitor dielectric layer 124 to serve as the upper electrode 116 of the storage capacitor. The overlapping portion between the upper electrode 116 and the lower electrode 114 is the principle area for holding electric charges. A passivation layer 122 is formed over the capacitor upper electrode 116 and other surrounding areas. The passivation layer 122 has an opening 202 that exposes a portion of the capacitor upper electrode 116. The opening 202 is formed, for example, in photolithographic and etching processes. A pixel electrode layer 200 is formed over the passivation layer and the opening 202. Thus, the pixel electrode layer 200 and the capacitor upper electrode 116 are electrically connected. The pixel electrode layer 200 includes a pixel electrode body 200b and a protruding section 200a. In FIG. 3B, the protruding section 200a and the pixel electrode body 200b are separated. However, they are actually connected by a neck section 200c.

Figure 3C:
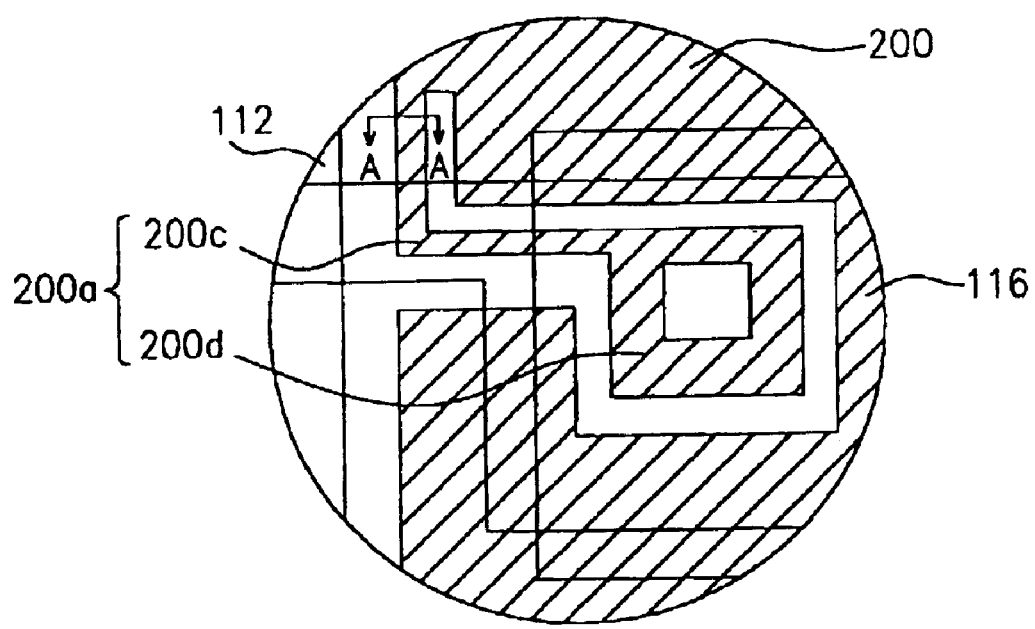
FIG. 3C is a magnified view of a local portion of the unit cell layout in FIG. 3A.

FIG. 3C is a magnified view of a local portion 204 of the unit cell layout in FIG. 3A. To facilitate demarcation of various areas, the pixel electrode layer 200 is marked with slash lines. The protruding section 200a comprises a connective section 200d and the neck section 200c. The protruding section 200a in FIG. 3C, for example, is an internal protruding structure facing the interior of the pixel electrode 200. The neck section 200c is positioned between the pixel electrode body 200b and the connective section 200d. As shown in FIGS. 3B and 3C, charge storage capability of the capacitor is lost when the capacitor upper electrode 116 and the capacitor lower electrode 114 are in short circuit due to the presence of some extrinsic residual material 115. A common voltage (Vcom) applied to the capacitor lower electrode 114 will also transmit to the pixel electrode layer 200 leading to a bright spot in the pixel.

In the presence of a protruding section 200a in the pixel electrode layer 200 according to this invention, bright pixel can be easily repaired by cutting the neck section 200c of the protruding section 200a, for example, through the application of an intense laser beam along A—A. By cutting the neck section 200c, the connective section 200d of the protruding section 200a separates from the pixel electrode body 200b. Detachment of the protruding section 200a and the pixel electrode body 200b can be observed in FIG. 3B.

Since the capacitor upper electrode 116 and the lower capacitor electrode 114 is still maintained in a short circuit state after cutting off the neck section 200c, the upper electrode 116 and the lower electrode 114 together with the connective section 200d have a common potential. However, the pixel electrode body 200b still connects with the thin film transistor 104. Hence, voltage at the pixel electrode body 200b is still controlled by the thin film transistor 104 unaffected by the common voltage (Vcom). In other words, the pixel electrode body 200b now becomes an upper electrode of the storage capacitor. The overlapping area between the pixel electrode body 200b and the upper electrode 116 or the lower electrode 114 forms a capacitor. Therefore, the required capacitance for normal operation of the pixel is roughly maintained and the repaired pixel is no longer a fixed dark spot.

In brief, the pixel electrode layer 200 includes an internal-facing protruding section 200a. When the two electrodes of the capacitor are in short circuit, the pixel electrode may be detached by cutting the neck section 200c of the protruding section 200a. The pixel electrode now turns into a capacitor electrode and the overlapping area between the pixel electrode and other capacitor electrodes creates a new functioning storage capacitor.

Figure 4:
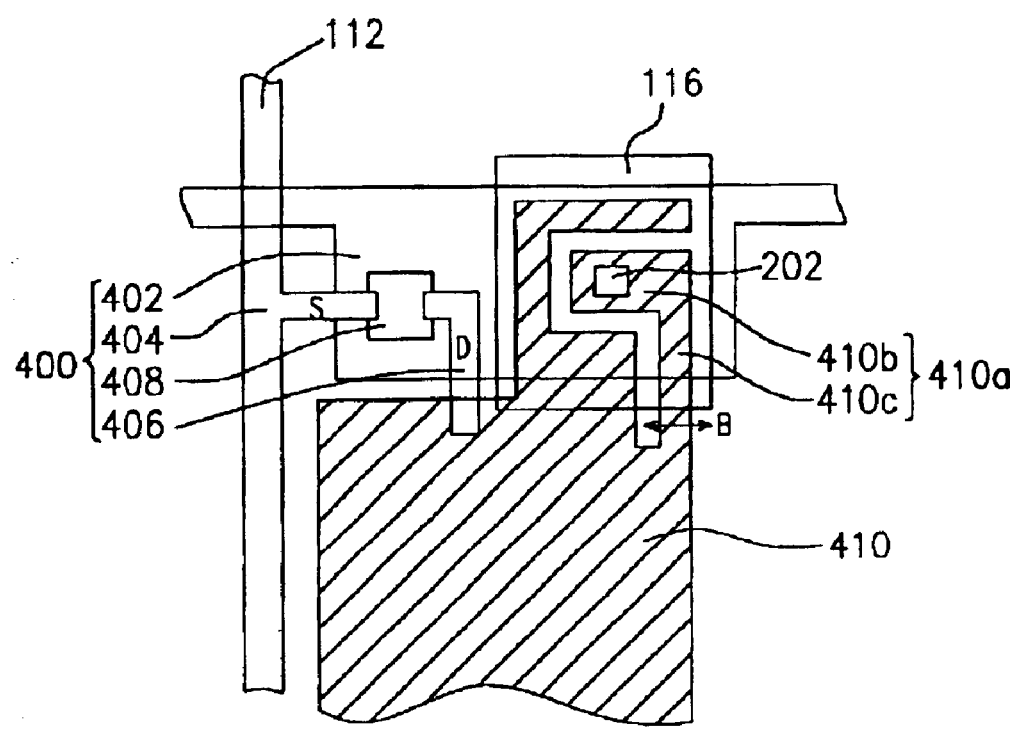
FIG. 4 is a schematic diagram showing the layout of a unit cell in a thin film transistor liquid crystal display according to a second preferred embodiment of this invention.

The protruding structure 200a may also be applied to a capacitor-on-gate (Cs-on-gate) design. FIG. 4 is a schematic diagram showing a unit cell of a thin film transistor liquid display having a capacitor-on-gate design according to this invention. As shown in FIG. 4, the thin film transistor 400 includes a gate electrode 402, a source terminal 404, a drain terminal 406 and a channel 408. Typically, the source terminal 404 and the drain terminal 406 are metallic layers and the channel 408 is an amorphous silicon layer. In a capacitor-on-gate design, the gate terminal 402 not only serves as a scan line 110 (refer to FIG. 3A), but also serves as a lower electrode of the capacitor. Hence, the gate terminal (lower electrode) 402 and an upper electrode 116 together form a storage capacitor. The source terminal 404 of the thin film transistor 400 is connected to a signal line 112 and the drain terminal 406 of the thin film transistor 400 is connected to a pixel electrode 410.

The pixel electrode 410 is also a major aspect in this embodiment of the invention. The pixel electrode 410 has a protruding section 410a such as an inward protruding structure. The protruding section 410a further comprises a connective section 410b and a neck section 410c. The connective section 410b and the upper electrode 116 are electrically connected through an opening 202. Thus, the upper electrode 116 and the drain terminal 406 are connected and controlled by the thin film transistor 400.

When the gate terminal (the lower electrode) 402 and the upper electrode 116 are short-circuited due to the presence of some residual foreign material, the location labeled B of the neck section 410c of the protruding section 410a may be cut open. Hence, the pixel electrode 410 is isolated from the capacitor. Thereafter, the overlapping portion between the pixel electrode 410 and the upper electrode 116 or the lower electrode 402 constitutes an equivalent capacitor that compensates for and permits the pixel to operate normally.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A storage capacitor structure on a substrate, comprising:
   a first capacitor electrode over the substrate;
   a capacitor dielectric layer over the first capacitor electrode;
   a second capacitor electrode over the capacitor dielectric layer, wherein the first capacitor electrode, the capacitor dielectric layer and the second capacitor electrode together form the storage capacitor;
   a passivation layer over the second capacitor electrode, wherein the passivation layer has an opening that exposes a portion of the second capacitor electrode; and
   a pixel electrode layer over the passivation layer, wherein the pixel electrode layer has a protruding section, and the second capacitor electrode and the pixel electrode layer are electrically connected using the protruding section through the opening in the passivation layer, and wherein when the first capacitor electrode comes in electrical contact with the second capacitor electrode, the protruding section can be cut so that the pixel electrode layer can serve as an upper capacitor electrode of the storage capacitor.

2. The capacitor structure of claim 1, wherein the pixel electrode layer can be separated from the second capacitor electrode by cutting the protruding section of the pixel electrode layer when the first capacitor electrode and the second capacitor electrode are shorted.

3. The capacitor structure of claim 1, wherein the pixel electrode layer has a neck section and a connective section such that the neck section can be cut while the connective section and the second capacitor electrode are electrically connected together.

4. The capacitor structure of claim 3, wherein the protruding structure in the pixel electrode layer is an inward protruding structure.

5. The capacitor structure of claim 1, wherein the pixel electrode layer is connected to a switching device.

6. The capacitor structure of claim 1, wherein the pixel electrode layer is electrically connected to a thin film transistor.

7. The capacitor structure of claim 6, wherein the first capacitor electrode is a portion of the gate terminal of the thin film transistor.

8. The capacitor structure of claim 1, wherein the second capacitor electrode is electrically connected to a common power source.

9. The capacitor structure of claim 1, wherein the pixel electrode layer has some overlapping region with the first capacitor electrode and the second capacitor electrode outside the protruding section.

10. A liquid crystal display device, comprising:
    a plurality of scan lines;
    a plurality of signal lines; and
    a plurality of pixels with each pixel having a liquid crystal cell, a pixel electrode connected to a storage capacitor having an upper electrode, a lower electrode and a capacitor dielectric sandwiched between the upper electrode and the lower electrode, and a switching element connected to one of the liquid crystal cells and the signal lines, wherein each switching element is connected to one of the scan lines;
    wherein the pixel electrode has a protruding section electrically connected to the upper electrode of the storage capacitor, wherein the protruding section can be detached from the pixel electrode.

11. The liquid crystal display device of claim 10, wherein the switching element includes a thin film transistor.

12. The liquid crystal display device of claim 10, wherein the protruding section includes an inward-protruding structure.

13. The liquid crystal display device of claim 10, wherein the lower electrode is a portion of the switching element.

14. A method of fabricating a storage capacitor, comprising the steps of:
 providing a substrate;
 forming a first capacitor electrode over the substrate;
 forming a capacitor dielectric layer over the first capacitor electrode;
 forming a second capacitor electrode over the capacitor dielectric layer, wherein the first capacitor electrode, the capacitor dielectric layer and the second capacitor electrode together form the storage capacitor.
 forming a passivation layer over the second capacitor electrode;
 patterning the passivation layer to form an opening that exposes a portion of the second capacitor electrode; and
 forming a pixel electrode layer over the passivation layer, wherein the pixel electrode layer has a protruding section such that the pixel electrode and the second capacitor electrode are electrically connected through the opening in the passivation layer, and the protruding section can be cut to detach the pixel electrode layer from the second capacitor electrode so that the pixel electrode layer can serve as an upper capacitor electrode of the storage capacitor.

15. The method of claim 14, wherein the pixel electrode layer can be detached from the second capacitor electrode by cutting open the protruding section.

16. The method of claim 14, wherein the step of forming the pixel electrode layer further includes the steps of:
 forming a pixel electrode layer over the passivation layer such that the pixel electrode layer and the second capacitor electrode are electrically connected through the opening; and
 patterning the pixel electrode layer to form the protruding section in the opening, wherein the protruding section includes a neck section and a connective section.

* * * * *